US012756214B2

(12) United States Patent
Hsiao

(10) Patent No.: US 12,756,214 B2
(45) Date of Patent: *Oct. 6, 2026

(54) WIRELESS CHARGING DEVICE

(71) Applicant: INVENTEC CORPORATION, Taipei (TW)

(72) Inventor: Chi-Cheng Hsiao, Taipei (TW)

(73) Assignee: INVENTEC CORPORATION, Taipei (TW)

( * ) Notice: Subject to any disclaimer, the term of this patent is extended or adjusted under 35 U.S.C. 154(b) by 879 days.

This patent is subject to a terminal disclaimer.

(21) Appl. No.: 18/112,009

(22) Filed: Feb. 21, 2023

(65) Prior Publication Data

US 2024/0039307 A1 Feb. 1, 2024

Related U.S. Application Data

(60) Provisional application No. 63/394,010, filed on Aug. 1, 2022.

(51) Int. Cl.

| | |
|---|---|
| ***H02J 50/00*** | (2016.01) |
| ***B60L 53/12*** | (2019.01) |
| ***B60L 53/124*** | (2019.01) |
| ***B60L 53/36*** | (2019.01) |
| ***B60L 53/38*** | (2019.01) |
| ***G05D 1/00*** | (2006.01) |
| ***H02J 7/65*** | (2026.01) |

(Continued)

(52) U.S. Cl.

CPC .............. *H02J 7/731* (2026.01); *B60L 53/12* (2019.02); *B60L 53/124* (2019.02); *B60L 53/36* (2019.02); *B60L 53/38* (2019.02); *G05D 1/021* (2013.01); *H02J 7/65* (2026.01); *H02J 7/70* (2026.01); *H02J 50/005* (2020.01); *H02J 50/10* (2016.02); *H02J 50/40* (2016.02); *H02J 50/402* (2020.01); *H02J 50/70* (2016.02); *H02J 50/90* (2016.02); *H05K 5/0214* (2022.08); *H05K 7/20136* (2013.01); *H05K 7/20145* (2013.01); *H02J 2207/10* (2020.01)

(58) Field of Classification Search

CPC ........................... H02J 7/0044; H05K 7/20136

USPC .......................................................... 320/108

See application file for complete search history.

(56) References Cited

U.S. PATENT DOCUMENTS 12,046,938 B2 * 7/2024 Selby .................. H02J 7/00309
2015/0084591 A1 * 3/2015 Kishima ............... H02J 7/0013 320/112

(Continued)

*Primary Examiner* — Ahmed H Omar

(74) *Attorney, Agent, or Firm* — Troutman Pepper Locke LLP; Tim Tingkang Xia, Esq.

(57) ABSTRACT

A wireless charging device is configured to charge two electronic devices. The wireless charging device includes a casing, a wireless charging module and a fan. The casing has an interior space, an air inlet, an air outlet and a support surface. The air inlet and the air outlet are in fluid communication with the interior space. The support surface faces away from the interior space, the support surface has two placement regions, the air inlet is located between the two placement regions, and the two placement regions are configured for the two electronic devices to be placed thereon. The wireless charging module is disposed in the interior space and corresponds to the two placement regions. The fan is disposed in the interior space and configured to suck air into the interior space through the air inlet and blow air out of the interior space through the air outlet.

14 Claims, 6 Drawing Sheets

(51) Int. Cl.

| | |
|---|---|
| ***H02J 7/70*** | (2026.01) |
| ***H02J 50/10*** | (2016.01) |
| ***H02J 50/40*** | (2016.01) |
| ***H02J 50/70*** | (2016.01) |
| ***H02J 50/90*** | (2016.01) |
| ***H05K 5/02*** | (2006.01) |
| ***H05K 7/20*** | (2006.01) |

(56) References Cited

U.S. PATENT DOCUMENTS

| | | | | |
|---|---|---|---|---|
| 2020/0075907 | A1* | 3/2020 | Shimazaki | H01M 50/249 |
| 2021/0167632 | A1* | 6/2021 | Burdenski | H02J 50/10 |
| 2021/0185854 | A1* | 6/2021 | Sui | H01F 27/085 |

* cited by examiner

WIRELESS CHARGING DEVICE

CROSS-REFERENCE TO RELATED APPLICATIONS

This non-provisional application claims priority under 35 U. S. C. § 119(a) on Provisional Patent Application No(s). 63,394,010 filed in U.S.A., on Aug. 1, 2022, the entire contents of which are hereby incorporated by reference.

BACKGROUND OF THE INVENTION

Technical Field of the Invention

The invention relates to a charging device, more particular to a wireless charging device.

Description of the Related Art

As the development and progress of technology, mobile devices, such as smartphones or tablet computers, can be connected to the vehicle system through application programs (e.g., CarPlay). In order to let users not to worry about the power consumption of mobile devices, wireless chargers are further applied to the vehicles so that the mobile devices can be connected to the vehicle system through the application programs while placed on the wireless chargers for charging.

When a mobile device is placed on a wireless charger for charging, the wireless charger and the mobile device both generate heat. Under the influence of these two kinds of heat, the charging efficiency of the wireless charger may be reduced. Therefore, how to solve the aforementioned issue is one of the crucial topics in this field.

SUMMARY OF THE INVENTION

The invention provides a wireless charging device which is capable of preventing heat generated by itself and the mobile device from adversely affecting the charging efficiency. One embodiment of the disclosure provides a wireless charging device. The wireless charging device is configured to charge two electronic devices. The wireless charging device includes a casing, a wireless charging module and a fan. The casing has an interior space, an air inlet, an air outlet and a support surface. The air inlet and the air outlet are in fluid communication with the interior space, the support surface faces away from the interior space, the support surface has two placement regions, the air inlet is located between the two placement regions, and the two placement regions are configured for the two electronic devices to be placed thereon. The wireless charging module is disposed in the interior space and corresponds to the two placement regions. The fan is disposed in the interior space and configured to suck air into the interior space through the air inlet and blow air out of the interior space through the air outlet.

According to the wireless charging device as disclosed in the above embodiment, the air inlet of the casing is located between the two placement regions for the electronic devices to be placed thereon, such that when the fan sucks air into the interior space through the air inlet, the airflow can firstly pass by the electronic devices to cool the electronic devices, and then the airflow enters into the interior space to cool the wireless charging module. Therefore, the electronic devices and the wireless charging device can be maintained in desired temperatures for maintaining the charging efficiency.

BRIEF DESCRIPTION OF THE DRAWINGS

The invention will become more fully understood from the detailed description given hereinbelow and the accompanying drawings which are given by way of illustration only and thus are not limitative of the present invention and wherein.

DETAILED DESCRIPTION

Figure 1:
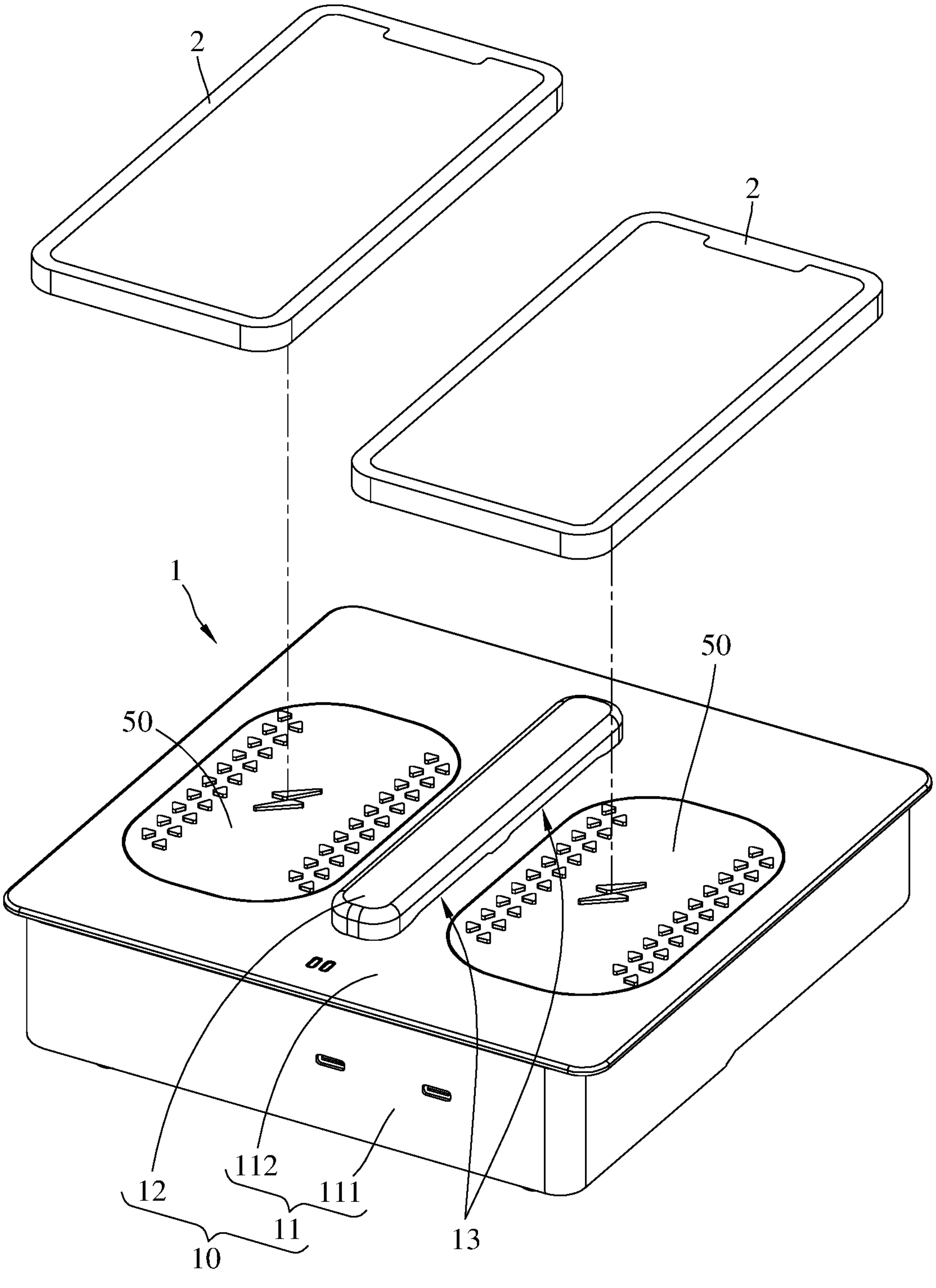
FIG. 1 is a perspective view of two electronic devices and a wireless charging device according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
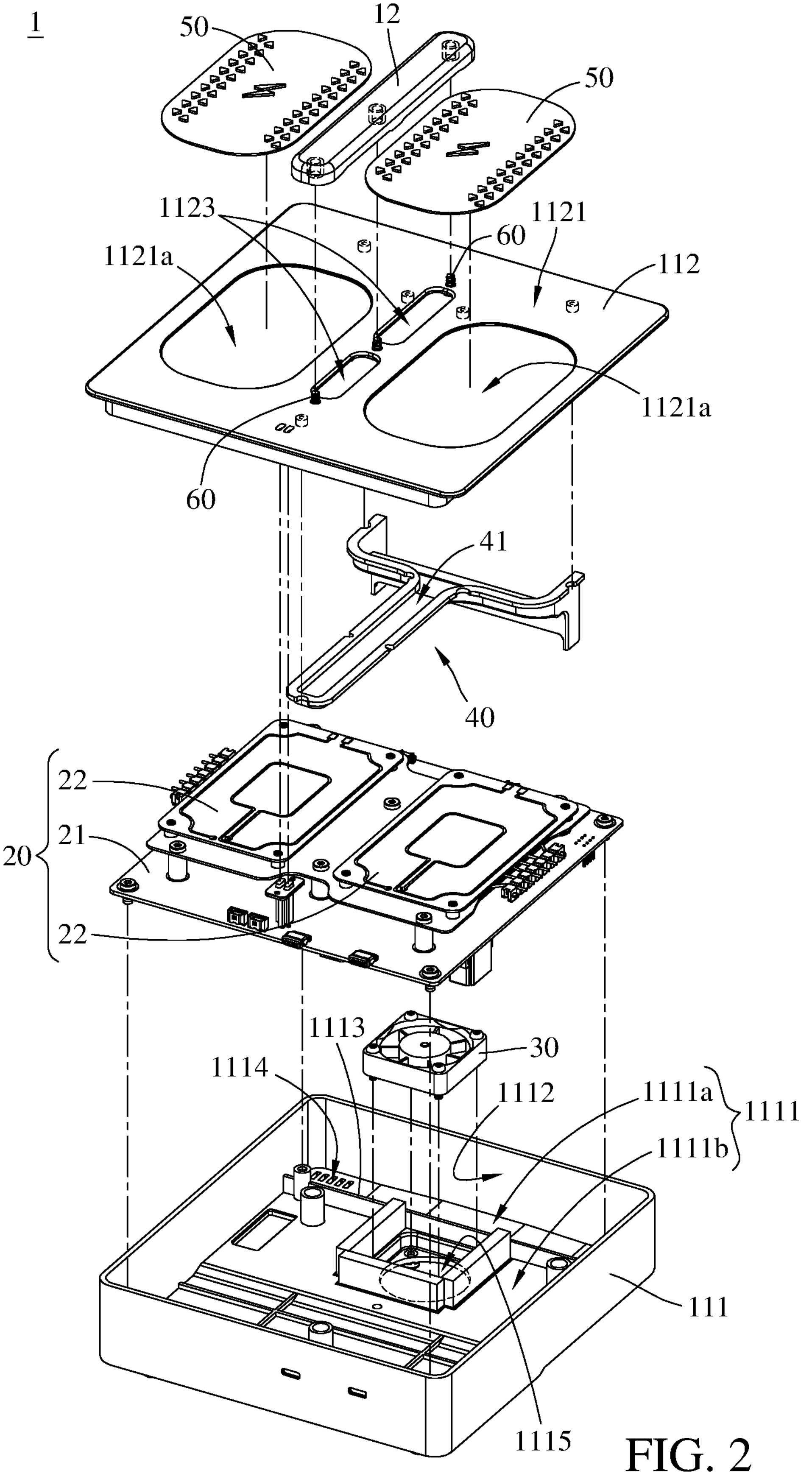
FIG. 2 is an exploded view of the wireless charging device in FIG. 1.

Refer to FIGS. 1 and 2, where FIG. 1 is a perspective view of two electronic devices 2 and a wireless charging device 1 according to one embodiment of the invention, and FIG. 2 is an exploded view of the wireless charging device 1 in FIG. 1.

In this embodiment, the wireless charging device 1 can charge the two electronic devices 2, where the electronic devices 2 are, for example, smartphones. The wireless charging device 1 includes a casing 10, a wireless charging module 20 and a fan 30. In addition, the wireless charging device 1 may further include a partition 40 and two support pads 50.

Figure 3:
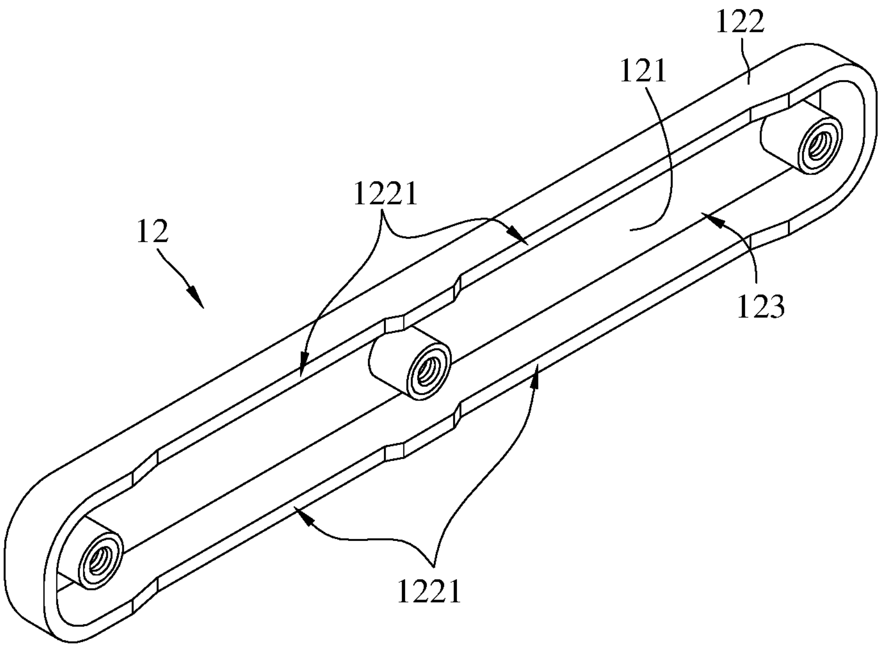
FIG. 3 is a perspective view of a baffle of the wireless charging device in FIG. 2.
Figure 4:
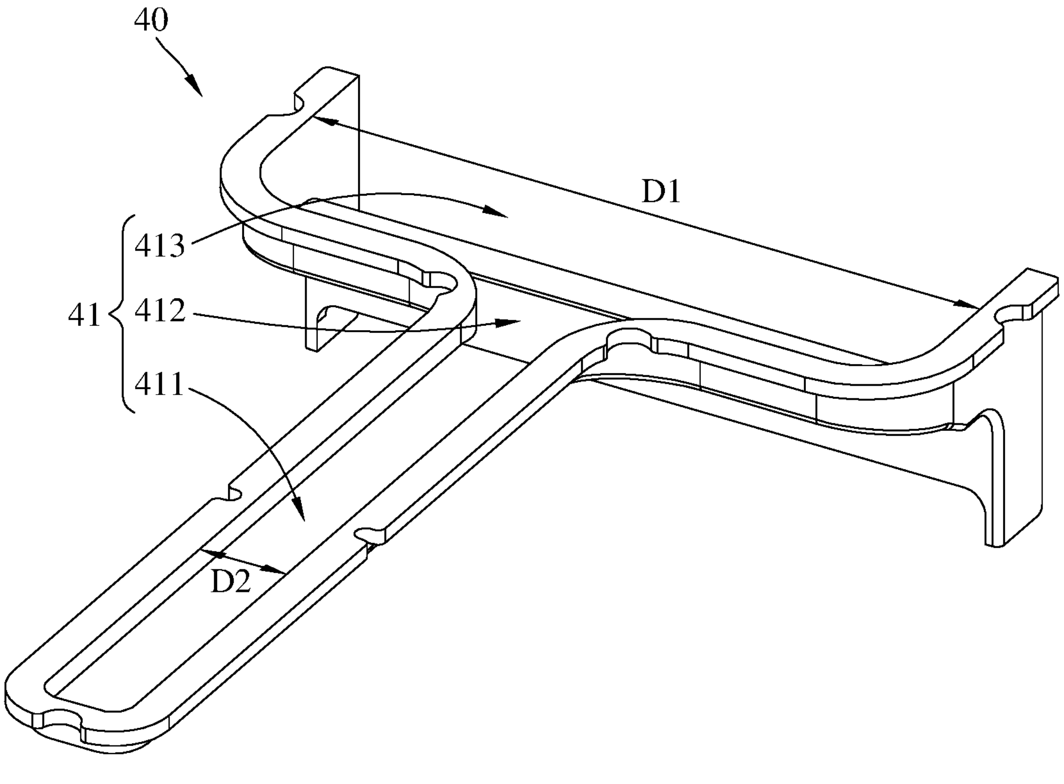
FIG. 4 is a perspective view of a partition of the wireless charging device in FIG. 2.
Figure 5:
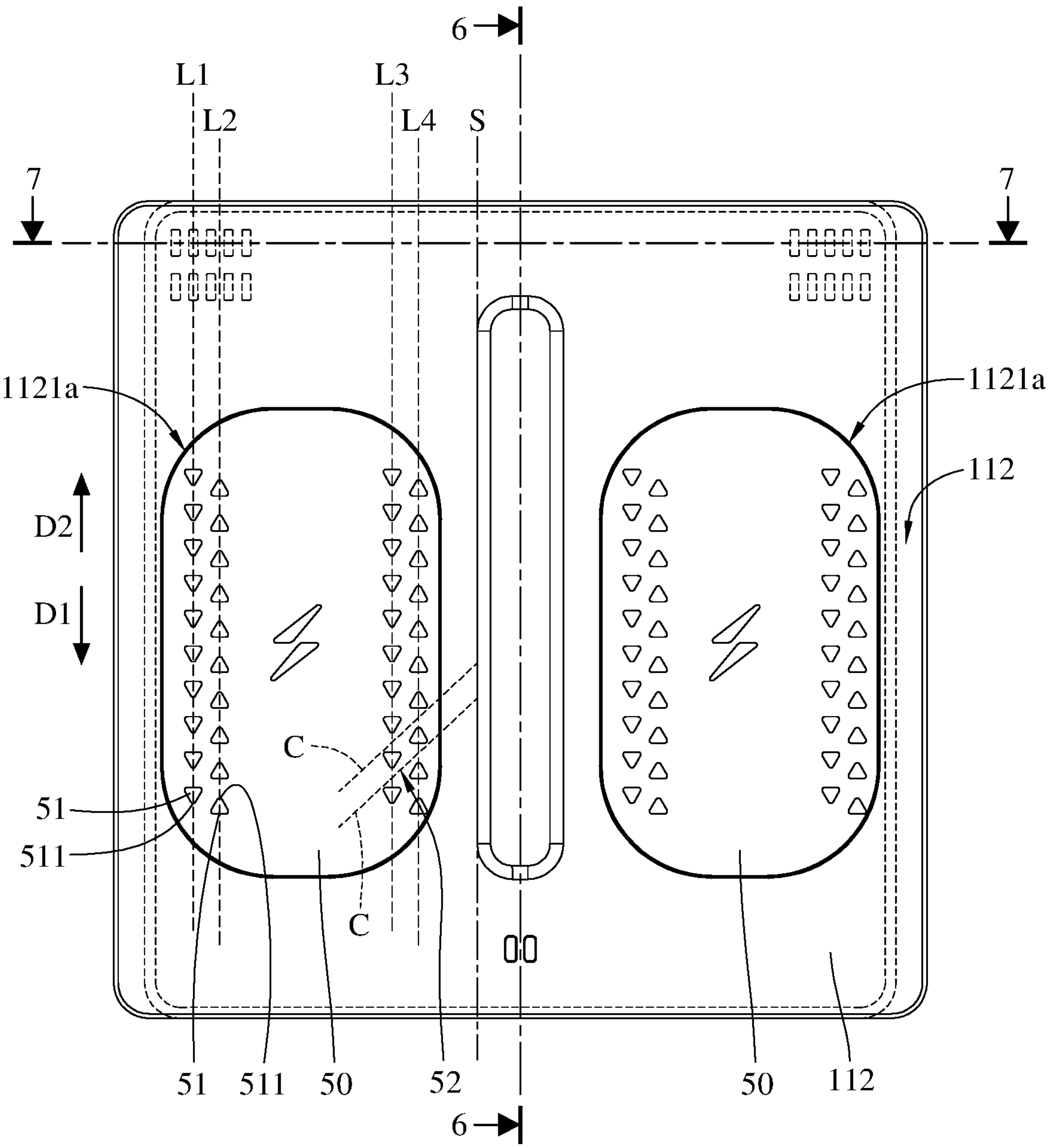
FIG. 5 is a top view of the wireless charging device in FIG. 1.
Figure 6:
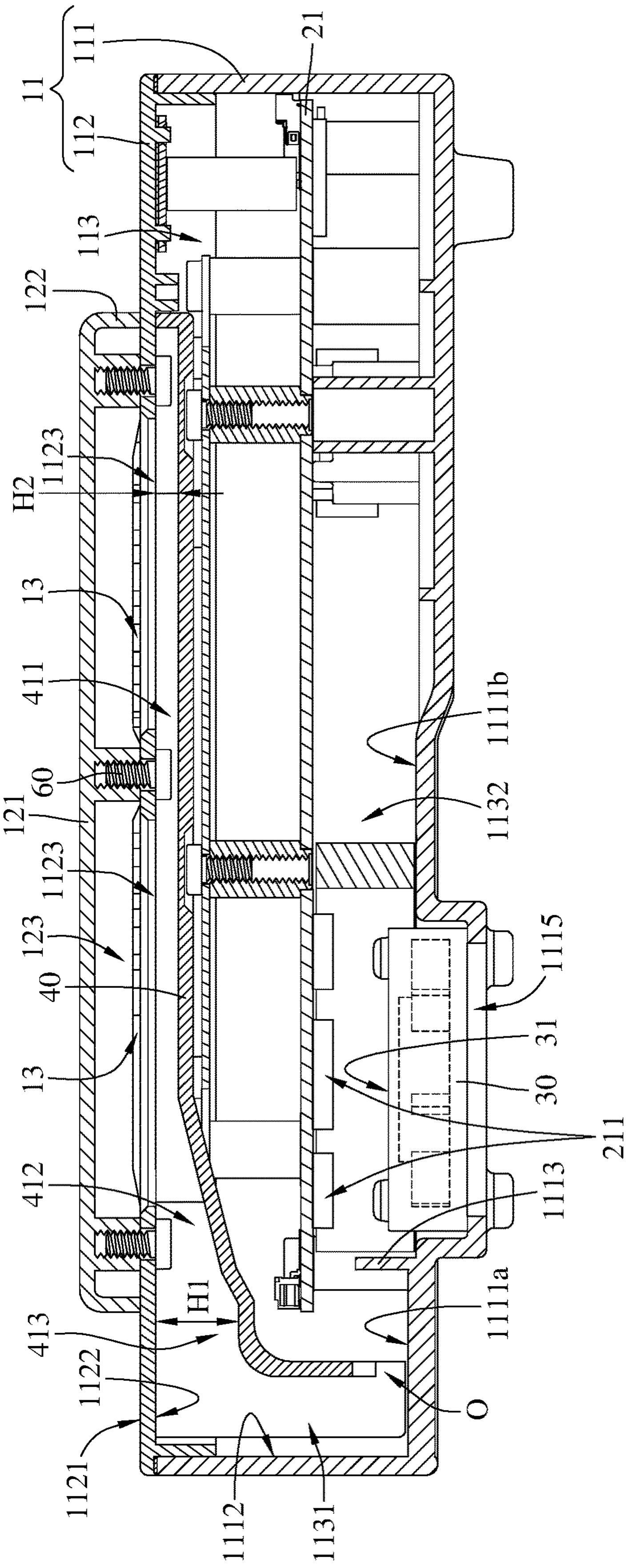
FIG. 6 is a cross-sectional view of the wireless charging device taken along a line 6-6 in FIG. 5.
Figure 7:
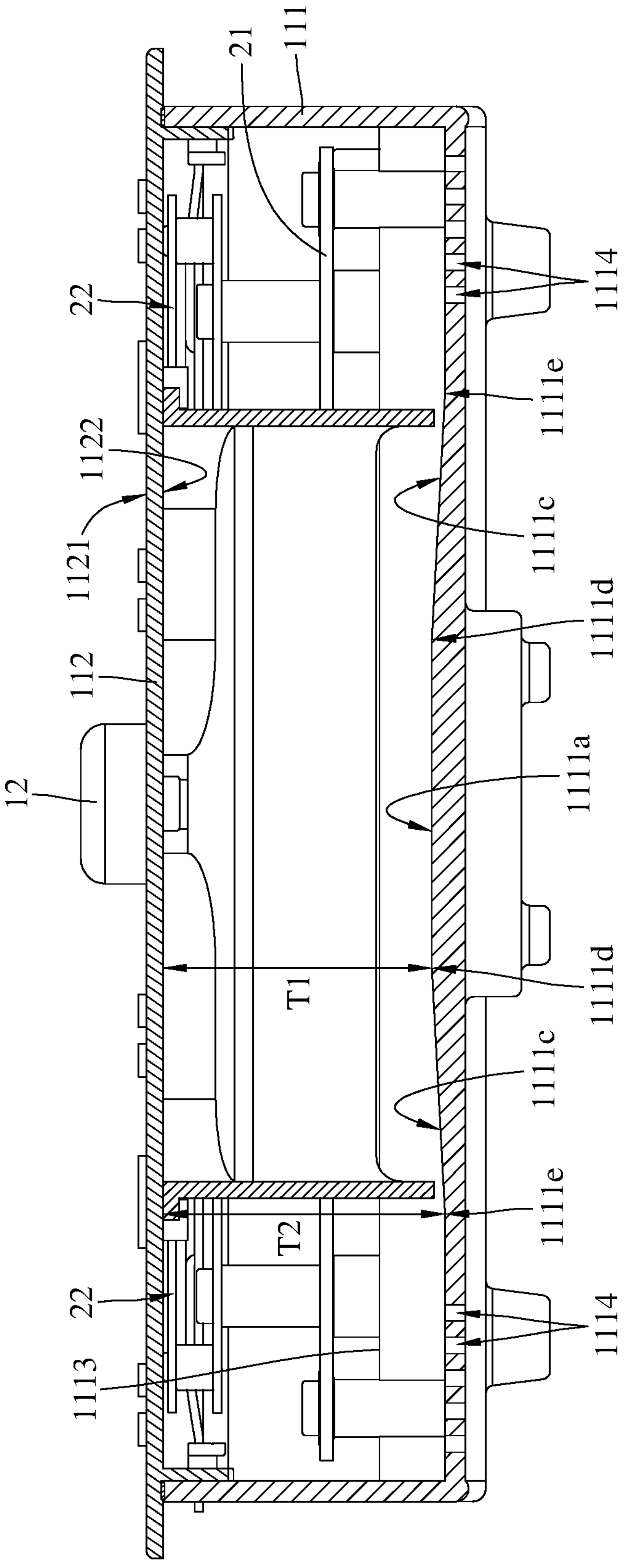
FIG. 7 is a cross-sectional view of the wireless charging device taken along a line 7-7 in FIG. 5.

Then, refer to FIG. 2 and FIGS. 3 to 7, where FIG. 3 is a perspective view of a baffle 12 of the wireless charging device 1 in FIG. 2, FIG. 4 is a perspective view of the partition 40 of the wireless charging device 1 in FIG. 2, FIG. 5 is a top view of the wireless charging device 1 in FIG. 1, FIG. 6 is a cross-sectional view of the wireless charging device 1 taken along a line 6-6 in FIG. and FIG. 7 is a cross-sectional view of the wireless charging device 1 taken along a line 7-7 in FIG. 5.

The casing 10 includes a main body 11 and a baffle 12. The main body 11 includes a base 111 and a cover 112 assembled with each other, and the base 111 and the cover 112 together form an interior space 113. The cover 112 has a support surface 1121, an inner top surface 1122 and two vent holes 1123. The support surface 1121 faces away from the interior space 113, and the support surface 1121 has two placement regions 1121*a*. The inner top surface 1122 faces away from the support surface 1121. The vent holes 1123 penetrate through the support surface 1121 and the inner top surface 1122, and the vent holes 1123 are located between the two placement regions 1121*a* of the support surface 1121. The baffle 12 includes a cover portion 121 and an annular wall portion 122. The annular wall portion 122 is connected to a periphery of the cover portion 121, and the annular wall portion 122 and the cover portion 121 together form a guide space 123. The annular wall portion 122 has four recesses 1221 located at one side of the annular wall portion 122 located farther away from the cover portion 121. The annular wall portion 122 is in contact with the support surface 1121 and surrounds the vent holes 1123. The four recesses 1221 and the support surface 1121 together form four air inlets 13. Two of the air inlets 13 are located at two opposite sides of one of the vent holes 1123, and the other two of the air inlets 13 are located at two opposite sides of the other of the vent holes 1123. The air inlets 13 are in fluid communication with the interior space 113 via the guide space 123 and the two vent holes 1123.

In this embodiment, the wireless charging device 1 may further include a plurality of screws 60. The baffle 12 is fixed to the cover 112 via the screws 60, but the disclosure is not limited thereto; in some other embodiments, the baffle may be adhered to the cover.

Note that the quantity of the vent holes 1123 is not restricted and may be modified to be one in some other embodiments. In addition, the quantity of the recesses 1221 of the baffle 12 is not restricted and may be modified to be two in some other embodiments, and the two recesses and the support surface form two air inlets. Moreover, the air inlets may not be formed by the baffle and the support surface; in some other embodiments, the air inlets may be directly formed on the support surface. In another embodiment, the quantity of the air inlet may be one.

The partition 40 is fixed to the inner top surface 1122 of the cover 112 of the main body 11 so as to divide the interior space 113 into a drainage channel 1131 and an accommodation area 1132. The accommodation area 1132 accommodates the wireless charging module 20 and the fan 30. The air inlets 13 are in fluid communication with the accommodation area 1132 via the guide space 123, the two vent holes 1123 and the drainage channel 1131.

Specifically, the partition 40 is fixed to the inner top surface 1122 of the cover 112 of the main body 11 via adhering manner. The partition 40 has a drainage groove 41, and the base 111 has an inner bottom surface 1111 and an inner lateral surface 1112. The inner bottom surface 1111 faces the inner top surface 1122, and the inner lateral surface 1112 is connected to the inner top surface 1122 and the inner bottom surface 1111. The inner top surface 1122 of the cover 112, the inner bottom surface 1111 and the inner lateral surface 1112 of the base 111 and the drainage groove 41 together form the drainage channel 1131. An opening 0 is formed between the partition and the inner bottom surface 1111 of the base 111, and the opening 0 is in fluid communication with the drainage channel 1131 and the accommodation area 1132.

The drainage groove 41 of the partition 40 has a narrow portion 411, a tapered portion 412 and a wide portion 413. The tapered portion 412 is located between and connected to the wide portion 413 and the narrow portion 411, and the narrow portion 411 is located farther away from the inner lateral surface 1112 than the wide portion 413. A width D1 of the wide portion 413 is greater than a width D2 of the narrow portion 411, and a width of the tapered portion 412 gradually increases along a direction from the narrow portion 411 towards the wide portion 413. In addition, a depth H1 of the wide portion 413 is greater than a depth H2 of the narrow portion 411, and a depth of the tapered portion 412 gradually increase along the direction from the narrow portion 411 towards the wide portion 413.

In this embodiment, the base 111 further has an embankment wall 1113, a plurality of drainage holes 1114 and an air outlet 1115. The embankment wall 1113 protrudes from the inner bottom surface 1111 and covers the opening 0. The embankment wall 1113 divides the inner bottom surface 1111 of the base 111 into a first region 1111*a* and a second region 1111*b*. At least part of the first region 1111*a* corresponds to the drainage channel 1131, and the second region 1111*b* corresponds to the accommodation area 1132. The drainage holes 1114 are located at the first region 1111*a* and in fluid communication with the drainage channel 1131. The first region 1111*a* has two drainage slopes 1111*c*. Each of the two drainage slopes 1111*c* has a first side 1111*d* and a second side 1111*e* located opposite to each other, where a distance T1 from the first side 1111*d* to the inner top surface 1122 is smaller than a distance T2 from the second side 1111*e* to the inner top surface 1122. The two drainage slopes 1111*c* are symmetrical with each other, and the first sides 1111*d* of the drainage slopes 1111*c* are located between the second sides 1111*e*. The drainage slopes 1111*c* are located between some of the drainage holes 1114 and the others. In each of the drainage slopes 1111*c*, the second side 1111*e* is located between the first side 1111*d* and some of the drainage holes 1114. The air outlet 1115 is located at the second region 1111*b* and in fluid communication with the accommodation area 1132.

In this embodiment, the embankment wall 1113 can prevent liquid from directly entering into the accommodation area 1132 after entering into the drainage channel 1131 through the air inlets 13 and landing on the first region 1111*a*, and thus prevent liquid from adversely affecting the wireless charging module 20 and the fan 30 in the accommodation area 1132.

Moreover, the drainage slopes 1111*c* help the liquid entering into the drainage channel 1131 through the air inlets 13 and landing on the first region 1111*a* to leave the drainage channel 1131 through the drainage holes 1114 so as to prevent the liquid from accumulating and overflowing the embankment wall 1113.

Note that the quantities of the drainage slopes 1111*c* and the drainage holes 1114 are not restricted in the invention and may be modified to be one in some other embodiments.

In this embodiment, the drainage groove 41 of the partition 40 with the narrower and shallower portion and the wider and deeper portion help to gather liquid entering into the drainage channel 1131 and guide liquid to land on the first region 1111*a*. Note that the drainage groove 41 of the partition 40 is not restricted to having the narrower and shallower portion and the wider and deeper portion; in some other embodiments, the drainage groove of the partition may have an uniform width and an uniform depth.

Moreover, the partition 40, the embankment wall 1113 and the drainage holes 1114 of the base 111 are optional structures. When there is no need to discharge liquid and prevent liquid from affecting the wireless charging module 20 and the fan 30, the partition 40, the embankment wall 1113 and the drainage holes 1114 of the base 111 may be omitted.

The wireless charging module 20 includes a circuit board 21 and two coil assemblies 22. The circuit board 21 is fixed to the base 111, and the circuit board 21 has a plurality of heat sources 211 located at a surface of the circuit board 21 facing the inner bottom surface 1111 of the base 111. The heat sources 211 are, for example, electronic components, such as chips. The coil assemblies 22 are fixed to the circuit board 21 and located at one side of the circuit board 21 located farther away from the inner bottom surface 1111 of the base 111. The coil assemblies 22 respectively correspond to the placement regions 1121*a* of the support surface 1121 of the cover 112. The coil assemblies 22 are respectively configured to charge the electronic devices 2 placed on the placement regions 1121*a* via a wireless manner.

The fan 30 is, for example, an axial fan. The fan 30 is fixed to the base 111 and located at the air outlet 1115 of the base 111. An air inlet side 31 of the fan 30 is located close to the heat sources 211 of the circuit board 21, such that the airflow entering into the fan 30 from the air inlet side 31 can cool the heat sources 211 of the circuit board 21.

The support pads 50 are, for example, made of rubber material. The support pads 50 are respectively disposed on the placement regions 1121*a* of the support surface 1121 of the cover 112. The support pads 50 are the same in structure, and thus the follow descriptions merely introduce one of them. The support pad 50 has a plurality of protrusions 51. The protrusions 51 are configured to support the electronic device 2. The protrusions 51 form a plurality of channels 52 (e.g., along lines C shown in FIG. 5) towards the air inlets 13. Specifically, the protrusions 51 are triangular protrusions and arranged along a first line L1, a second line L2, a third line L3 and a fourth line L4 which are parallel to one another. The first line L1, the second line L2, the third line L3 and the fourth line L4 are parallel to a plane S where the air inlets 13 are located, and the second line L2 and the third line L3 are located between the first line L1 and the fourth line L4. Corners 511 of some the protrusions 51 arranged along the first line L1 and the third line L3 point towards a first direction D1, and corners 511 of the others of the protrusions 51 arranged along the second line L2 and the fourth line L4 point towards a second direction D2, where the first direction D1 is opposite to the second direction D2. Some of the protrusions 51 arranged along the first line L1 and the second line L2 are in a staggered arrangement, and the others of the protrusions 51 arranged along the third line L3 and the fourth line L4 are in a staggered arrangement.

In this embodiment, the protrusions 51 can support the electronic devices 2 and prevent the electronic devices 2 from moving accidentally. In addition, the protrusions 51 can uplift the electronic devices 2, such that, during the operation of the fan 30, the channels 52 formed by the protrusions 51 can guide the external airflow towards the air inlets 13 from the bottoms of the electronic devices 2.

Note that the arrangements and shapes of the protrusions 51 of the support pad 50 are not restricted and may be modified according to actual requirements.

In this embodiment, the support pads 50 are the same in structure instead of being symmetrical with each other, and thus there is no need to produce two support pads symmetrical with each other, thereby saving cost. Note that the support pads 50 are optional components and may be omitted in some other embodiments.

During the operation of the fan 30, the airflow entering into the interior space 113 through the air inlets 13 flows into the accommodation area 1132 along the drainage channel 1131, such that the airflow can cool the heat sources 211 of the circuit board 21 and the coil assemblies 22 of the wireless charging module 20, thereby maintaining the charging efficiency. Then, the fan 30 blows air out of the accommodation area 1132.

Accordingly, the air inlets 13 of the casing 10 are located between the two placement regions 1121*a* for the electronic devices 2 to be placed thereon, such that when the fan 30 sucks air into the interior space 113 through the air inlets 13, the airflow can firstly pass by the electronic devices 2 to cool the electronic devices 2, and then the airflow enters into the interior space 113 to cool the wireless charging module 20. Therefore, the electronic devices 2 and the wireless charging device 1 can be maintained in desired temperatures for maintaining the charging efficiency.

According to the wireless charging device as disclosed in the above embodiment, the air inlets of the casing are located between the two placement regions for the electronic devices to be placed thereon, such that when the fan sucks air into the interior space through the air inlets, the airflow can firstly pass by the electronic devices to cool the electronic devices, and then the airflow enters into the interior space to cool the wireless charging module. Therefore, the electronic devices and the wireless charging device can be maintained in desired temperatures for maintaining the charging efficiency.

In one embodiment of the invention, the wireless charging device may be applied in a vehicle, such as self-driving vehicle, electric vehicle, or semi-self-driving vehicle.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A wireless charging device, configured to charge two electronic devices, comprising:

a casing, having an interior space, at least one air inlet, an air outlet and a support surface, wherein the at least one air inlet and the air outlet are in fluid communication with the interior space, the support surface faces away from the interior space, the support surface has two placement regions, the at least one air inlet is located between the two placement regions, and the two placement regions are configured for the two electronic devices to be placed thereon;

a wireless charging module, disposed in the interior space and corresponding to the two placement regions; and a fan, disposed in the interior space and configured to suck air into the interior space through the at least one air inlet and blow air out of the interior space through the air outlet;

wherein the casing include a main body and a baffle, the interior space, the air outlet and the support surface are located at the main body, the main body has at least one vent hole, the at least one vent hole is located at the support surface and between the two placement regions, the baffle comprises a cover portion and an annular wall portion, the annular wall portion is connected to a periphery of the cover portion, the annular wall portion and the cover portion together form a guide space, the annular wall portion has a plurality of recesses located at one side of the annular wall portion located farther away from the cover portion, the annular wall portion is in contact with the support surface and surrounds the at least one vent hole, the quantity of the at least one air inlet is plural, the air inlets are respectively formed at the plurality of recesses, and the air inlets are in fluid communication with the interior space through the guide space and the at least one vent hole.

2. The wireless charging device according to claim 1, further comprising a partition, wherein the partition is connected to the casing and located in the interior space, the partition divides the interior space into a drainage channel and an accommodation area, the casing further has at least one drainage hole, the air inlets and the at least one drainage hole are in fluid communication with the drainage channel, the air outlet is in fluid communication with the accommodation area, and at least part of the wireless charging module and the fan are located in the accommodation area.

3. The wireless charging device according to claim 2, wherein the casing further has an inner top surface, an inner bottom surface and an embankment wall, the inner top surface faces away from the support surface, the inner bottom surface faces the inner top surface, the air outlet and the at least one drainage hole are located at the inner bottom surface, the embankment wall protrudes from the inner bottom surface, the partition is fixed to the inner top surface, an opening is formed between the partition and the inner bottom surface, and the embankment wall covers the opening.

4. The wireless charging device according to claim 3, wherein the partition has a drainage groove, the casing has an inner lateral surface, the inner lateral surface is connected to the inner top surface and the inner bottom surface, the inner top surface, the inner bottom surface, the inner lateral surface and the drainage groove together form the drainage channel, the drainage groove has a wide portion and a narrow portion connected to each other, a width of the wide portion is greater than a width of the narrow portion, and the narrow portion is located farther away from the inner lateral surface than the wide portion.

5. The wireless charging device according to claim 4, wherein the drainage groove further has a tapered portion, the tapered portion is connected to the wide portion and the narrow portion, and a width of the tapered portion gradually increases along a direction from the narrow portion towards the wide portion.

6. The wireless charging device according to claim 5, wherein a depth of the wide portion is greater than a depth of the narrow portion, and a depth of the tapered portion gradually increases along the direction from the narrow portion towards the wide portion.

7. The wireless charging device according to claim 3, wherein the embankment wall divides the inner bottom surface into a first region and a second region, at least part of the first region corresponds to the drainage channel, the second region corresponds to the accommodation area, the first region has at least one drainage slope, the at least one drainage slope has a first side and a second side located opposite to each other, a distance from the first side to the inner top surface is smaller than a distance from the second side to the inner top surface, and the second side is located between the first side and the at least one drainage hole.

8. The wireless charging device according to claim 7, wherein the quantity of the at least one drainage hole and the quantity of the at least one drainage slope both are two, the two drainage slopes are symmetrical to each other, and the two drainage slopes are located between the two drainage holes.

9. The wireless charging device according to claim 1, wherein the quantity of the at least one vent hole is two, the quantity of the plurality of recesses is four, the quantity of the air inlets is four, two of the air inlets are located at two opposite sides of one of the two vent holes, and the other two of the air inlets are located at two opposite sides of the other one of the two vent holes.

10. The wireless charging device according to claim 1, further comprising a plurality of screws, wherein the baffle is fixed to the main body via the plurality of screws.

11. The wireless charging device according to claim 1, further comprising two support pads, wherein the two support pads are respectively disposed at the two placement regions, each of the two support pads has a plurality of protrusions, the plurality of protrusions are configured to support the two electronic devices, and the plurality of protrusions form a plurality of channels towards the air inlets.

12. The wireless charging device according to claim 11, wherein in each of the two support pads, the plurality of protrusions are triangular protrusions and arranged along a first line, a second line, a third line and a fourth line which are parallel to one another, the second line and the third line are located between the first line and the fourth line, corners of some of the plurality of protrusions arranged along the first line and the third line point towards a first direction, corners of the others of the plurality of protrusions arranged along the second line and the fourth line point towards a second direction, the first direction is opposite to the second direction, some of the plurality of protrusions arranged along the first line and the second line are in a staggered arrangement, and the others of the plurality of protrusions arranged along the third line and the fourth line are in a staggered arrangement.

13. The wireless charging device according to claim 12, wherein the first line, the second line, the third line and the fourth line are parallel to a plane where at least one of the air inlets is located.

14. The wireless charging device according to claim 1, wherein the wireless charging module comprises a circuit board and two coil assemblies, the two coil assemblies respectively correspond to the two placement regions, the circuit board is located closer to the fan than the two coil assemblies, the circuit board has at least one heat source, and the at least one heat source is located close to an air inlet side of the fan.

* * * * *